(12) United States Patent
Zeng et al.

(10) Patent No.: US 10,930,731 B2
(45) Date of Patent: Feb. 23, 2021

(54) INTEGRATED CIRCUIT DEVICE

(71) Applicant: MEDIATEK Singapore Pte. Ltd., Singapore (SG)

(72) Inventors: Zheng Zeng, San Jose, CA (US); Kuo-En Huang, Hsin-Chu (TW)

(73) Assignee: MEDIATEK Singapore Pte. Ltd., Singapore (SG)

(*) Notice: Subject to any disclaimer, the term of this patent is extended or adjusted under 35 U.S.C. 154(b) by 0 days.

(21) Appl. No.: 16/440,716

(22) Filed: Jun. 13, 2019

(65) Prior Publication Data

US 2020/0127085 A1 Apr. 23, 2020

Related U.S. Application Data

(60) Provisional application No. 62/747,708, filed on Oct. 19, 2018.

(51) Int. Cl.
*H01L 29/06* (2006.01)
*H01L 27/088* (2006.01)
*H01L 23/535* (2006.01)
*H01L 23/522* (2006.01)

(52) U.S. Cl.
CPC ...... *H01L 29/0619* (2013.01); *H01L 23/5222* (2013.01); *H01L 23/535* (2013.01); *H01L 27/0886* (2013.01)

(58) Field of Classification Search
CPC ............. H01L 27/088; H01L 27/0251; H01L 27/14689; H01L 29/0619; H01L 29/1095; H01L 29/0623; H01L 29/407; H01L 29/735; H01L 2224/48247; H01L 2224/73265
See application file for complete search history.

(56) References Cited

U.S. PATENT DOCUMENTS

| 9,455,251 | B1 | 9/2016 | Christensen et al. |
| 2005/0160389 | A1 | 7/2005 | Arai et al. |
| 2009/0121322 | A1 | 5/2009 | Ozawa |
| 2013/0119449 | A1 | 5/2013 | Chen et al. |

(Continued)

FOREIGN PATENT DOCUMENTS

JP 2004-296880 A 10/2004

OTHER PUBLICATIONS

Extended European Search Report dated Feb. 21, 2020 for European Application No. EP 19204183.8.

*Primary Examiner* — Caridad Everhart
(74) *Attorney, Agent, or Firm* — Wolf, Greenfield & Sacks, P.C.

(57) ABSTRACT

An integrated circuit device is provided. The integrated circuit device includes a semiconductor substrate having a circuit area and a guarding area surrounding the circuit area. A guarding structure is formed in the guarding area, and includes a diffusion region in the semiconductor substrate. The guarding structure also includes a gate stack disposed on the semiconductor substrate and positioned adjacent to the diffusion region. The guarding structure further includes a guarding layer disposed on the gate stack. The gate stack extends in a first direction while the guarding layer extends in a second direction that is different from the first direction. The guarding layer is electrically insulated from the diffusion region. Thus, an integrated circuit device including a guarding structure with several capacitors is provided.

20 Claims, 7 Drawing Sheets

(56) References Cited

U.S. PATENT DOCUMENTS

| | | | | |
|---|---|---|---|---|
| 2013/0134560 A1* | 5/2013 | Wholey | ................ | H01L 23/564 |
| | | | | 257/629 |
| 2014/0306296 A1* | 10/2014 | Jeon | ..................... | H01L 21/266 |
| | | | | 257/401 |
| 2020/0105887 A1* | 4/2020 | Kundu | ................ | H01L 29/0638 |

* cited by examiner

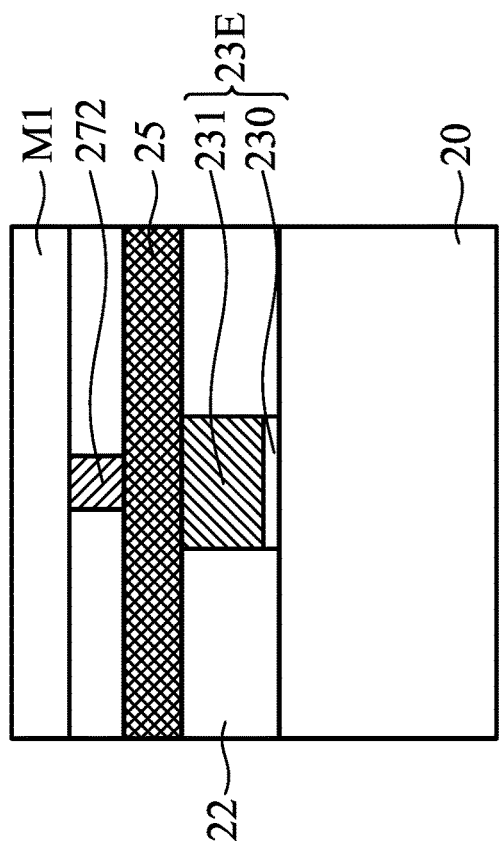
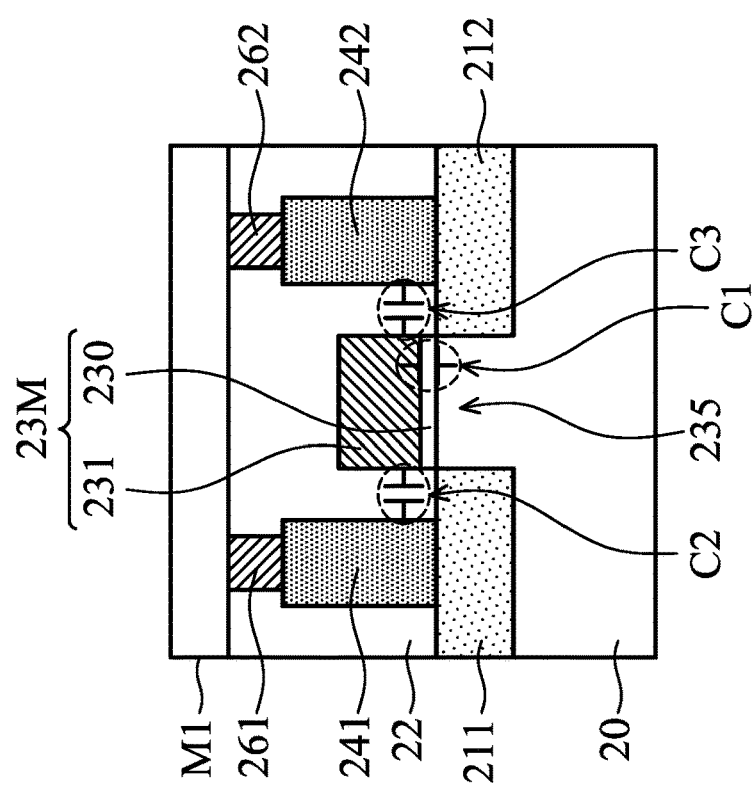
FIG. 3B
FIG. 3A

INTEGRATED CIRCUIT DEVICE

CROSS REFERENCE TO RELATED APPLICATIONS

This application is based on, and claims priority of U.S. Provisional Application No. 62/747,708 filed on Oct. 19, 2018, and entitled "INNOVATIVE GUARDRING WITH EMBEDDED DECAP V2," the entirety of which are incorporated by reference herein.

BACKGROUND OF THE INVENTION

Field of the Invention

The present invention relates to an integrated circuit device, and in particular to an integrated circuit device with a guarding structure having capacitors.

Description of the Related Art

Semiconductor device manufacturers are tasked to deliver products that are expected to perform at a certain level of quality. In an integrated circuit (IC), noise generated in one circuit or device may interfere with the operation of other circuits or devices in the IC. Generation of noise often degrades the performance of the IC.

Guarding structures such as guard rings are widely used in guarding areas of substrates as noise isolation components between the devices or circuits within an IC. For example, the guard rings surround the devices or circuits of the IC in order to suppress the noise or reduce the interference between adjacent devices or circuits. Guarding structures are more important for high-frequency circuits (such as radio frequency circuits) that are susceptible to interference and noise.

In recent years, as electronic products have been become increasingly multifunctional and have been scaled down in size, there is a desire for manufacturers of semiconductor devices to improve the density and functionalities of the devices formed on a single semiconductor wafer. However, the conventional guarding structures in the guarding areas merely have guarding function and occupy a certain amount of areas of the device, which limits scaling of reducing size of semiconductor devices. Thus, a novel structure integrated circuit device with improved guarding structures is one of desirable goals for manufacturers.

BRIEF SUMMARY OF THE INVENTION

An embodiment of the invention provides an integrated circuit device including a guarding structure with several capacitors on a semiconductor substrate. An exemplary embodiment of an integrated circuit device includes a semiconductor substrate having a circuit area and a guarding area surrounding the circuit area, and a guarding structure in the guarding area. The guarding structure includes a diffusion region in the semiconductor substrate, and a gate stack disposed on the semiconductor substrate and positioned adjacent to the diffusion region. The guarding structure also includes a connecting structure disposed on and electrically connected to the diffusion region. The guarding structure further includes a guarding layer disposed on the gate stack. The gate stack extends in a first direction, and the guarding layer extends in a second direction. The second direction is different from the first direction. Also, the guarding layer is electrically insulated from the first connecting structure.

Another exemplary embodiment of an integrated circuit device includes a semiconductor substrate and a guarding structure in a guarding area of the semiconductor substrate. The semiconductor substrate includes a circuit area and the guarding area surrounding the circuit area. The guarding structure includes a diffusion region in the semiconductor substrate and several gate stacks disposed on the semiconductor substrate. The gate stacks are positioned adjacent to the diffusion region. The guarding structure also includes a guarding layer disposed on the gate stacks and electrically connected to the gate stacks. The gate stacks extend in a first direction, while the guarding layer extends in a second direction. The second direction is different from the first direction. Also, the guarding layer is electrically insulated from the diffusion region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3A is a cross-sectional view taken along line 3A-3A of the semiconductor structure of FIG. 2B.

FIG. 3B is a cross-sectional view taken along line 3B-3B of the semiconductor structure of FIG. 2B.

DETAILED DESCRIPTION OF THE INVENTION

Figure 1:
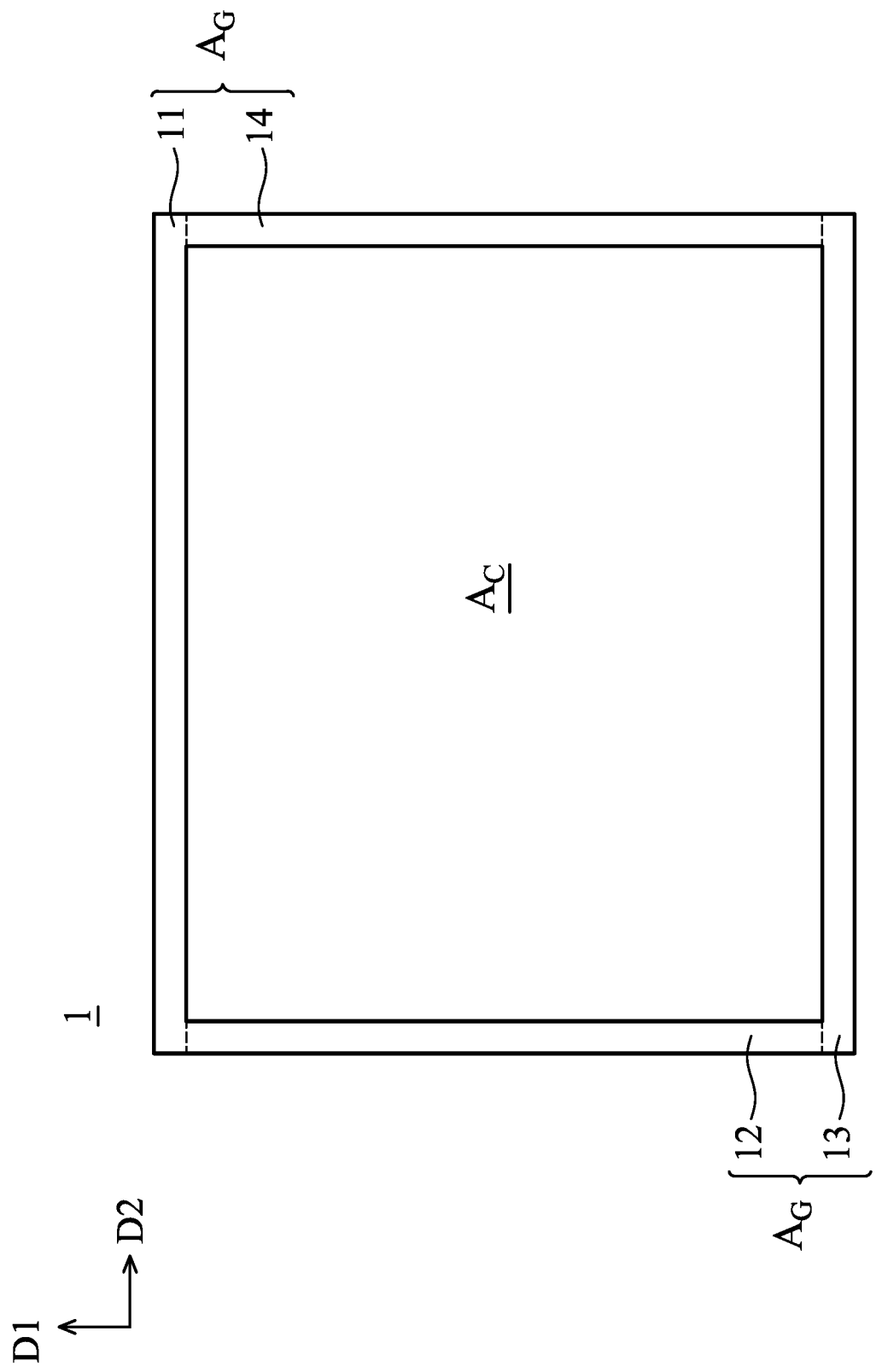
FIG. 1 is a top view of an integrated circuit device, in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The inventive concept will is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "connected" or "coupled" to another element, it may be directly connected or coupled to the other element or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same or similar reference numerals or reference designators denote the same or similar elements throughout the specification.

Embodiments provide an integrated circuit device. An exemplary embodiment of an integrated circuit device includes a guarding structure with several capacitors on a semiconductor substrate. The guarding structure is formed within a guarding area that surrounds a circuit area for reducing the noise and the interference between devices or circuits in adjacent circuit areas. According to the embodiments, a guarding structure includes a gate stack, a diffusion region adjacent to the gate stack and a guarding layer disposed on the gate stack. The guarding layer is electrically insulated from the diffusion region. The guarding structure also includes a connecting structure disposed on and electrically connected to the diffusion region. The guarding layer is electrically insulated from the connecting structure. Therefore, the guarding structure of the embodiment not only reduces the noise between the circuits in adjacent circuit areas, but also provides function of capacitors such as decoupling capacitors in the guarding area. Consequently, the areas required for forming the capacitors in the circuit areas can be significantly reduced, and an overall area of the integrated circuit device can be decreased. With the configurations in the embodied integrated circuit device, the flexibility for designing the capacitors on the semiconductor substrate, especially the capacitors in the circuit area of the semiconductor substrate, can be significantly improved.

FIG. 1 is a top view of an integrated circuit device, in accordance with some embodiments of the disclosure. In some embodiments, an integrated circuit device 1 includes a semiconductor substrate having a circuit area $A_C$ and a guarding area $A_G$ surrounding the circuit area $A_C$. Circuit components or active elements (such as a metal-oxide-semiconductor field-effect transistor (MOSFET), a FinFET, or another suitable transistor) are formed in the circuit area $A_C$, and guarding structures are disposed in the guarding area $A_G$. Many transistors may be formed on the semiconductor substrate in addition to capacitors, inductors, resistors, diodes, conductive lines, or other elements, depending on the circuit design. A field effect transistor (FET) is one type of transistors. Also, the capacitors typically include metal capacitors and metal-oxide-semiconductor (MOS) capacitors. For reasons of simplicity and clarity, these circuit components or elements in the circuit area $A_C$ are not depicted in FIG. 1 and also not discussed herein in detail.

Although FIG. 1 depicts one circuit area $A_C$ surrounded by a guarding area $A_G$ including guarding structures (not shown), a semiconductor substrate may include several circuit areas in the practical applications, and several guarding areas including guarding structures are disposed between adjacent circuit areas for noise isolation. To simplify the diagram, only a circuit area $A_C$ is depicted herein as an example.

Also, in some embodiments, the guarding area $A_G$ includes four zones adjacent to the circuit area $A_C$. As shown in FIG. 1, a guarding area $A_G$ includes a first zone 11, a second zone 12, a third zone 13 and a fourth zone 14. The first zone 13 is opposite the third zone 13, and the fourth zone 14 is opposite the second zone 12. Two ends of the second zone 12 adjoin the first zone 11 and the third zone 13, respectively. Similarly, two ends of the fourth zone 14 adjoin the first zone 11 and the third zone 13, respectively. In this example, the first zone 11 and the third zone 13 can be respectively regarded as an upper zone and a lower zone, while the second zone 12 and the fourth zone 14 can be respectively regarded as a left zone and a right zone. Those spatially relative terms, such as "lower", "upper", "right" and "left" are used herein to describe spatial relationship between the exemplified four zones of the guarding area $A_G$ as illustrated in FIG. 1, and intended to encompass different orientations of those features in use in addition to the orientation depicted in the drawings.

Figure 2A:
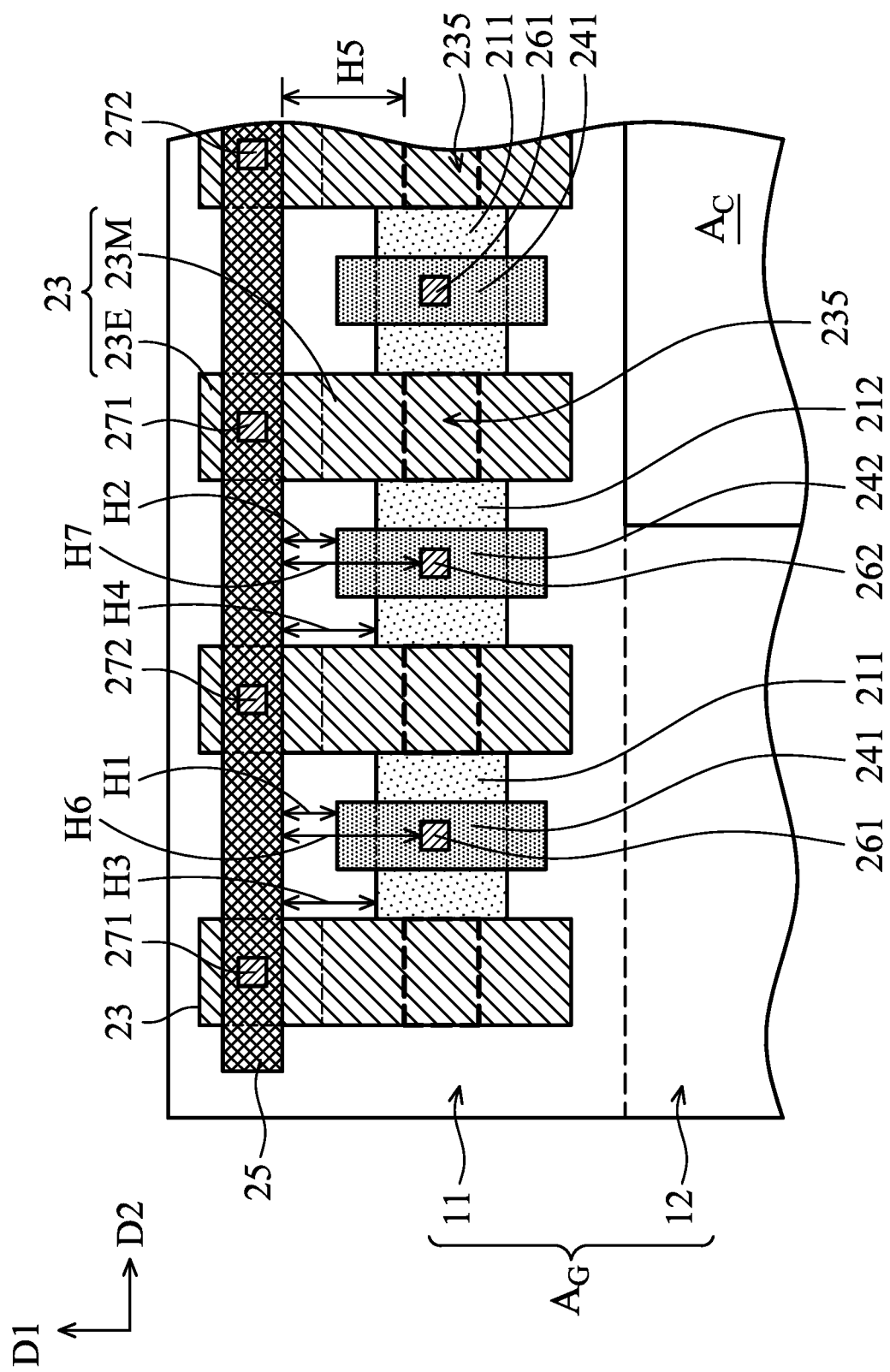
FIG. 2A is an enlarged view of guarding structures in a part of the first zone of the guarding area in FIG. 1.
Figure 2B:
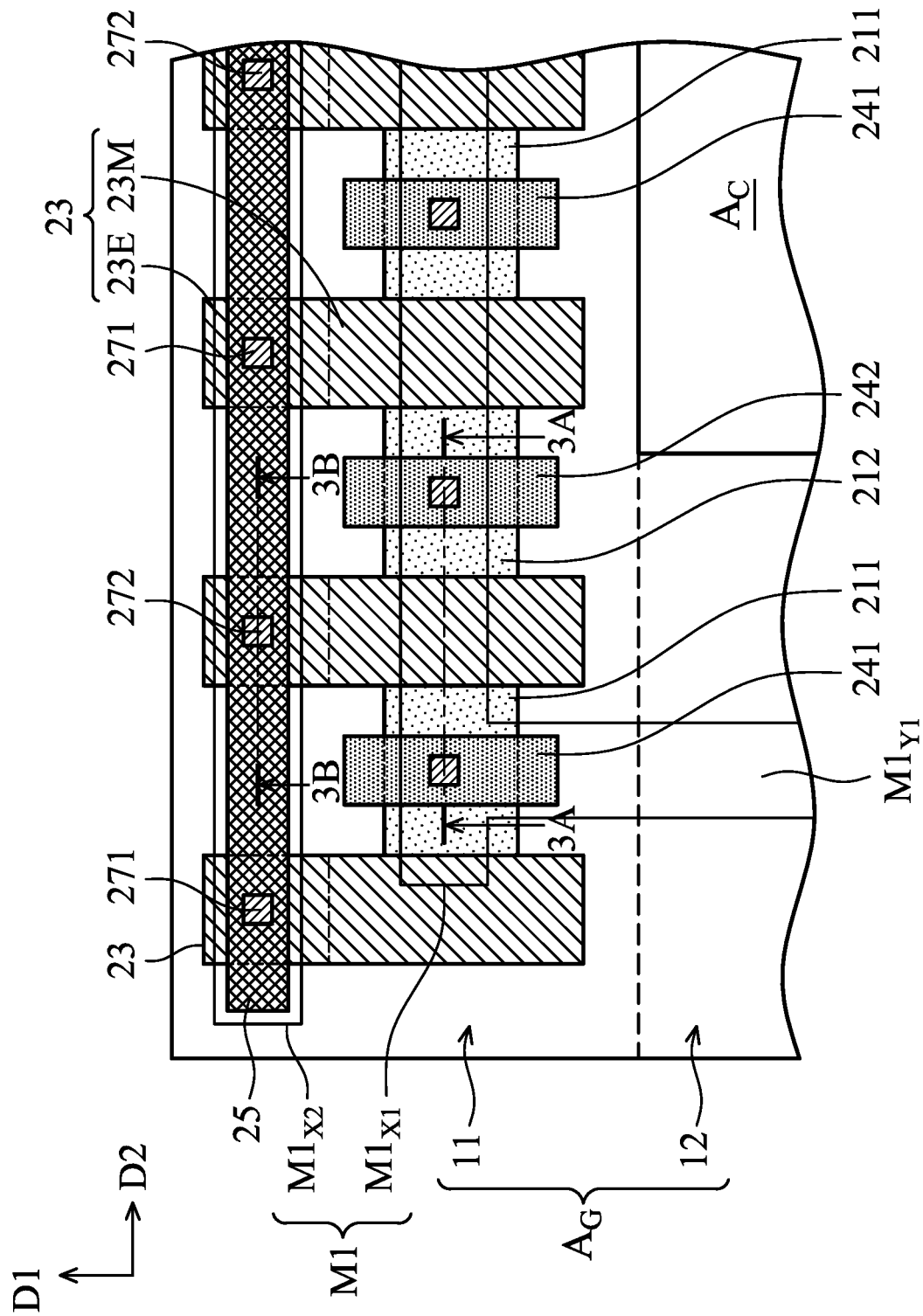
FIG. 2B depict conductive layers formed on the structure of FIG. 2A.

FIG. 2A is an enlarged view of the guarding structures in a part of the first zone of the guarding area in FIG. 1. FIG. 2B depict conductive layers (such as the metal layers $M1_{X1}$, $M1_{X2}$ and $M1_{Y1}$) formed on the structure of FIG. 2A. FIG. 3A is a cross-sectional view taken along line 3A-3A of the semiconductor structure of FIG. 2B. FIG. 3B is a cross-sectional view taken along line 3B-3B of the semiconductor structure of FIG. 2B.

Referring to FIG. 2A, FIG. 2B, FIG. 3A and FIG. 3B, a guarding structure include a diffusion region 211/212 formed in the semiconductor substrate 20, and a gate stack 23 disposed on the semiconductor substrate 20 and positioned adjacent to the diffusion region. In some embodiments, the guarding structure also include a connecting structure 241/242 disposed on and electrically connected to the diffusion region 211/212. In some embodiments, the guarding structure further includes a guarding layer 25 disposed on the gate stack 23, and the guarding layer 25 is electrically insulated from the connecting structure 241/242. That is, the guarding layer 25 is electrically insulated from the diffusion region 211/212. According to the embodiments, each of the guarding structures provides capacitors in the guarding area $A_G$.

In some embodiments, the semiconductor substrate 20 is a bulk semiconductor substrate such as a semiconductor wafer. For example, the semiconductor substrate 20 is a silicon wafer. The semiconductor substrate 20 may include silicon or another elementary semiconductor material such as germanium. In some other embodiments, the semiconductor substrate 20 includes a compound semiconductor. The compound semiconductor may include gallium arsenide, silicon carbide, indium arsenide, another suitable compound semiconductor, or a combination thereof. In some embodiments, the semiconductor substrate 20 includes a semiconductor-on-insulator (SOI) substrate.

A configuration of an exemplary guarding structure is related to a gate stack disposed between two diffusion regions. In some embodiments, as shown in FIG. 2A and FIG. 3A, a guarding structure includes a first diffusion region 211 and a second diffusion region 212 in the semiconductor substrate 20. The guarding structure also includes a gate stack 23 disposed on the semiconductor substrate 20, and the gate stack 23 is positioned between the first diffusion region 211 and the second diffusion region 212. The guarding structure further includes a first connecting structure 241 and a second connecting structure 242 disposed on and electrically connected to the first diffusion region 211 and the second diffusion region 212, respectively. The guarding structure also includes a guarding layer 25 disposed on the gate stack 23. From a top view of the semiconductor substrate 20, the guarding layer 25 is disposed across the gate stack 23, in accordance with some embodiments. In some embodiments, the gate stack 23 extends in a first direction D1, and the guarding layer 25 extends in a second direction D2. The second direction D2 is different from the first direction D1. In some embodiments, the second direction D2 is perpendicular to the first direction D1.

In some embodiments, each of the gate stacks 23 includes a gate dielectric layer 230 and a gate electrode layer 231 disposed on the gate dielectric layer 230. In some embodiments, the gate dielectric layer 231 is made of silicon oxide, silicon nitride, silicon oxynitride, low-k dielectric material, one or more other suitable dielectric materials, or a combination thereof. In accordance with some embodiments, the gate dielectric layer 230 and the gate electrode layer 231 are deposited using a chemical vapor deposition (CVD) process, an atomic layer deposition (ALD) process, a physical vapor deposition (PVD) process, another applicable process, or a combination thereof. The gate electrode layer 231 may include polysilicon, a metal material, one or more other suitable conductive materials, or a combination thereof.

Moreover, as shown in FIG. 2A, the guarding layer 25 on the gate stacks electrically connects the gate stacks in the first zone 11 of the guarding area $A_G$. In some embodiments, the guarding layer 25 includes metal, polysilicon, one or more other suitable conductive materials, or a combination thereof. In one example, the bottommost metal (metal-zero, M0) layer formed by middle-end-of-line (MEOL) processes is implemented as the guarding layer 25. The bottommost metal layer may include copper, tungsten, aluminum, nickel, titanium, one or more other suitable conductive materials, or a combination thereof. Furthermore, in some embodiments, the connecting structures, such as the first connecting structures 241 and the second connecting structures 242, include one or more suitable conductive materials. For example, the connecting structure includes one or more conductive materials having a resistance greater than the resistance of metal.

Also, in accordance with the embodiments, a dielectric layer 22 is deposited on the semiconductor substrate 20. The dielectric layer 22 may include multiple dielectric material films. The gate stacks 23, the guarding layer 25 and the connecting structures 241/242 are buried in the dielectric layer 22. Therefore, the guarding layer 25 of the embodiment is electrically insulated from the connecting structures 241 and the second connecting structures 242 by the dielectric layer 22. In some embodiments, the dielectric layer 22 is made of silicon oxide, silicon nitride, silicon oxynitride, low dielectric constant (low-k) material, one or more other suitable materials, or a combination thereof.

In some embodiments, the guarding layer 25 is disposed on a portion of the gate stack 23. In this exemplary embodiment, each of the gate stacks 23 includes a first portion 23M and a second portion 23E connected to the first portion 23M, as shown in FIG. 2A and FIG. 2B. The second portion 23E may extend in the first direction D1. It should be noted that FIG. 3A is a cross-sectional view related to the first portion 23M of the gate stack 23, and FIG. 3B is a cross-sectional view related to the second portion 23E of the gate stack 23. In some embodiments, the guarding layer 25 is disposed on the second portion 23E of the gate stacks 23 to achieve electrical connection between the gate stacks 23 of the guarding structure. From a top view of the semiconductor substrate 20, the guarding layer 25 is separated from the first connecting structure 241 in the first direction D1, by, for example, a first distance H1 as depicted in FIG. 2A. Similarly, the guarding layer 25 is separated from the second connecting structure 242 in the first direction D1, by, for example, a second distance H2 as depicted in FIG. 2A.

In some embodiments, the second portion 23E can be configured as being directly extended from the first portion 23M, as shown in FIG. 2A and FIG. 2B. In other embodiments, the second portion 23E may adjoin the first portion 23M or connect the first portion 23M through another conductive portion for achieving electrical connection. Therefore, the second portion 23E and the first portion 23M of a gate stack 23 can be made of the same material or different materials, as long as the second portion 23E and the first portion 23M are conductive and electrically connected to each other to construct the gate stack, in accordance with some embodiments.

Furthermore, the guarding layer 25 of the embodiments is electrically insulated from the first diffusion region 211 and the second diffusion region 212. From a top view of the semiconductor substrate 20, the guarding layer 25 is separated from the first diffusion region 211 and the second diffusion region 212 in the first direction D1. In some embodiments, the guarding layer 25 is separated from the first diffusion region by a third distance H3 in the first direction D1, and separated from the second diffusion region by a fourth distance H4 in the first direction D1, as shown in FIG. 2A.

In some embodiments, the first diffusion region 211 and the second diffusion region 212 function as a source region and a drain region, respectively. For example, the integrated circuit device may further include fins extend in the second direction D2, and each of the gate stacks 23 is formed on top and opposite sidewalls of the fins. A portion of each of the fins overlapping the gate stack 23 is defined as a channel region 235 of each of the fins. The channel region 235 is positioned between the first diffusion region 211 (such as the source) and the second diffusion region 212 (such as the drain). As shown in FIG. 2A, the guarding layer 25 that extends in the second direction D2 is separated from the channel region 235 by, for example, a fifth distance H5 in the first direction D1.

In some embodiments, as shown in FIGS. 2A, 2B and 3A, the guarding structure further includes a first via 261 and a second via 262 formed on the first connecting structure 241 and the second connecting structure 242, respectively. The guarding layer 25 that extends in the second direction D2 is also electrically insulated from the first via 261 and the second via 262. For example, from a top view of the semiconductor substrate 20, the guarding layer 25 is separated from the first via 261 by a sixth distance H6 in the first direction D1, and separated from the second via 262 by a seventh distance H7 in the first direction D1, as shown in FIG. 2A and FIG. 2B.

In some embodiments, the guarding structure further includes contact vias 271 and 272 on the guarding layer 25. Each of the contact vias is electrically connected to the second portion 23E of the gate stack 23 by the guarding layer 25. Also, the contact vias 271 and 272 are electrically insulated from the first vias 261 and the second vias 262 by the dielectric layer 22. Moreover, the first vias 261, the second vias 262 and the contact vias 271 and 272 may include copper, tungsten, aluminum, nickel, titanium, one or more other suitable conductive materials, or a combination thereof.

In accordance with some embodiments, the IMD layers, other metal layers and vias (not shown) are further formed by back-end-of-line (BEOL) processes and positioned on the dielectric layer 22, the first vias 261, the second vias 262, and the contact vias 271 and 272.

In some embodiments, a conductive layer such as a metal layer $M1_{X2}$ is further formed on the contact vias 271 and 272, as shown in FIG. 2B and FIG. 3B. Thus, the metal layer $M1_{X2}$ is disposed above guarding layer 25 and electrically connected to the gate stacks 23 in the guarding area $A_G$. In some embodiments, another metal layer $M1_{X1}$ is formed on the first vias 261 and the second vias 262, as shown in FIG. 2B and FIG. 3A. Thus, the metal layer $M1_{X1}$ is electrically connected to the first connecting structures 241, the second connecting structures 242, the first diffusion regions 211 and the second diffusion regions 212

In some practical applications, the first diffusion regions 211 and the second diffusion regions 212 are coupled to a first voltage supply respectively through the first vias 261, the first connecting structures 241, the second vias 262 and the second connecting structures 242. The gate stacks 23 are coupled to a second voltage supply through the contact vias 272, wherein the second voltage supply is different from the first voltage supply. When the first voltage supply and the second voltage supply apply different voltages to the diffusion regions 211/212 and the gate stacks 23, two or more capacitors (such as decoupling capacitors) are constructed in the guarding structures of the embodiment, thereby generating capacitances. For example, two capacitors are formed between the gate stack 23 and each of the first connecting structure 241 and the second connecting structure 242. Also, another capacitor can be formed between the gate stack 23 and the semiconductor substrate 20.

In some embodiments, the gate electrode layer 231 of the gate stack 23 and the semiconductor substrate 20 form a first capacitor C1, as shown in FIG. 3A. In some embodiments, the gate electrode layer 231 of the gate stack 23 and the first connecting structure 241 form a second capacitor C2, as shown in FIG. 3A. In some embodiments, the gate electrode layer 231 of the gate stack 23 and the second connecting structure 242 form a third capacitor C3, as shown in FIG. 3A. Those capacitors may function as decoupling capacitors that suppress or reduce noise in power supply signal. When the first voltage supply applies a first voltage to the first connecting structure 241 and the second connecting structure 242 while the second voltage supply applies a second voltage different from the first voltage to the gate stack 23, the capacitances of the first capacitor C1, the second capacitor C2 and the third capacitor C3 are not zero. According to some embodiments, the first voltage supply also applies the first voltage to the first diffusion region 211 and the second diffusion region 212 because first connecting structure 241 and the second connecting structure 242 are electrically connected to the first diffusion region 211 and the second diffusion region 212, respectively.

In some embodiments, the capacitance of the first capacitor C1 is greater than the capacitance of the second capacitor C2 and also greater than the capacitance of the third capacitor C3. In some embodiments, the capacitance of the first capacitor C1 is much greater than the capacitance of the second capacitor C2 (C1>>C2), and is also much greater than the capacitance of the third capacitor C3 (C1>>C3). In a non-limiting example, the capacitance of the second capacitor C2 is substantially equal to the capacitance of the third capacitor C3.

For a typical integrated circuit device, there are several decoupling capacitors formed in the circuit area of the integrated circuit device. The use of these decoupling capacitors is for reducing undesirable circuit power noise and for solving the dynamic IR drops of the integrated circuit device. In general, the circuit structures of decoupling capacitors vary under different design requirements. One of the most common types of the decoupling capacitors is a metal-oxide-semiconductor (MOS) capacitor. Since a conventional guarding structure with dummy gates in the guarding area shorts with active diffusion regions to ground, the conventional guarding structure does not provide any capacitor for the integrated circuit device. However, in accordance with the guarding structure of the embodiments, when different voltages are independently applied to the gate stacks and diffusion regions, several capacitors, such as the first capacitor C1, the second capacitor C2 and the third capacitor C3 as described above, can be constructed in the guarding structure of the embodiments. The first capacitor C1, the second capacitor C2 and the third capacitor C3 are configured substantially the same as MOS capacitors, functioning as decoupling capacitors for reducing undesirable circuit power noise of the integrated circuit device.

Figure 4:
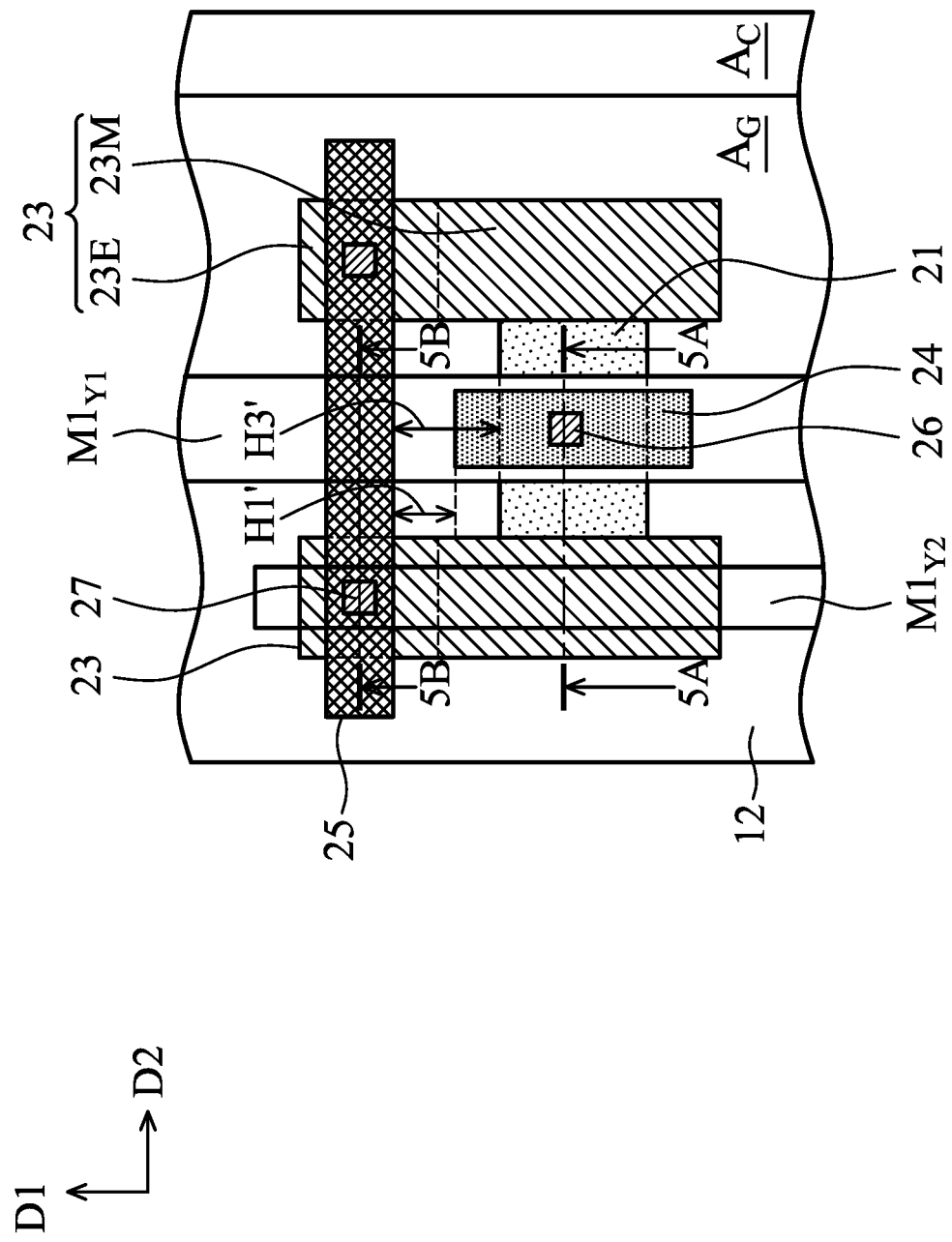
FIG. 4 is an enlarged view of a guarding structure in a part of the second zone of the guarding area in FIG. 1.
Figure 5A:
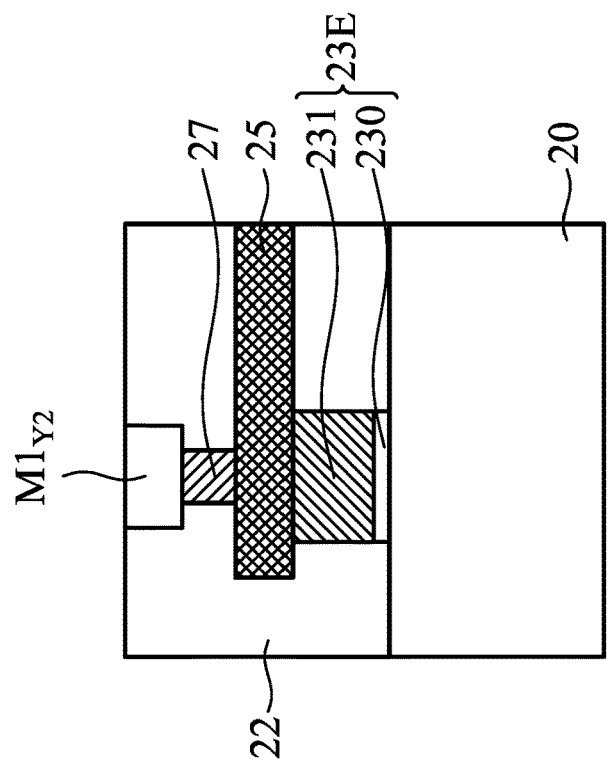
FIG. 5A is a cross-sectional view taken along line 5A-5A of the semiconductor structure of FIG. 4.
Figure 5B:
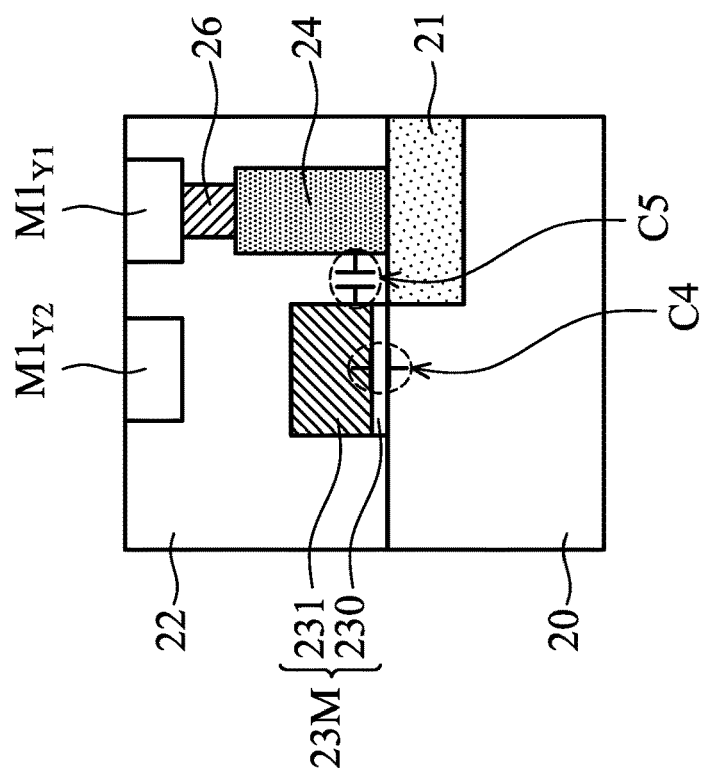
FIG. 5B is a cross-sectional view taken along line 5B-5B of the semiconductor structure of FIG. 4.

Configurations of the guarding structures in the second zone 12 (such as the left zone) and/or the fourth zone (such as the right zone) 14 of the guarding area $A_G$ may be slightly different from the configuration of the guarding structures in the first zone (such as the upper zone) 11 and the third zone (such as the lower zone) 13 of the guarding area $A_G$ in the practical applications. FIG. 4 is an enlarged view of a guarding structure in a part of the second zone of the guarding area in FIG. 1. FIG. 5A is a cross-sectional view taken along line 5A-5A of the semiconductor structure of FIG. 4. FIG. 5B is a cross-sectional view taken along line 5B-5B of the semiconductor structure of FIG. 4. The elements in FIGS. 4, 5A and 5B identical or similar to the elements in FIGS. 2A, 2B, 3A and 3B are designated with the same or similar reference numerals, and some repeated elements are not redundantly described for brevity.

In this exemplified embodiment, a guarding structure in the second zone 12 or in the fourth zone 14 (not shown) includes a diffusion region 21 formed in the semiconductor substrate 20. The guarding structure also includes at least a gate stack 23 disposed on the semiconductor substrate 20 and positioned adjacent to the diffusion region 21, as shown in FIG. 4. The guarding structure includes a connecting structure 24 disposed on and electrically connected to the diffusion region 21. The guarding structure further includes a guarding layer 25 disposed on the gate stack 23, and the guarding layer 25 is electrically insulated from the diffusion region 21, as shown in FIG. 4. Also, in some embodiments, a dielectric layer 22 is deposited on the semiconductor substrate 20 for covering the diffusion region 21 and filling the spaces between the gate stacks 23, the guarding layer 25 and the connecting structure 24. Therefore, the connecting structure 24 electrically connected to the diffusion region 21 is electrically insulated from the guarding layer 25 by the dielectric layer 22.

For instance, the guarding layer 25 is separated from the connecting structure 24 by, for example, a first distance H1' in the first direction D1. The guarding layer 25 is also separated from the diffusion region 21 by, for example, a third distance H3' in the first direction D1, as shown in FIG. 4. For the guarding structures in the first zone 11 and the second zone 12, the first distance H1 (FIG. 2A) can be the same or different from the first distance H1' (FIG. 4). Similarly, the third distance H3 (FIG. 2A) can be the same or different from the third distance H3' (FIG. 4).

The actual numerical values of the distances between the guarding layer 25 and the connecting structure 24/241/242 can be modified and determined according to the design conditions of the practical applications. Similarly, the actual numerical values of the distances between the guarding layer 25 and the diffusion regions 21/211/212 can be modified and determined based on the design conditions. For example, those distances between the guarding layer 25 and the related components (such as connecting structures or the diffusion regions) can be determined based on the number of the guarding structures to be arranged in the zones of the guarding area $A_G$, and also based on the size of the guarding structure related to the dimensions of the guarding area $A_G$.

In some embodiments, the guarding structure in the second zone 12 is different form the guarding structure in the first zone 11 by a slight modification. As shown in FIG. 4, a guarding structure in the second zone 12 of the guarding area $A_G$ may include two gate stacks 23 and a diffusion region 21. The diffusion region 21 is positioned between the two gate stacks 23. When the voltages are independently applied to the gate stacks 23 and the diffusion region 21, the diffusion region 21 may function as a source region while a drain region is floating. In some embodiments, the gate stacks 23 extend in the first direction D1, and the guarding layer 25 extends in the second direction D2. The second direction D2 is different from the first direction D1. In a non-limiting example, the second direction D2 is perpendicular to the first direction D1.

Also, in some embodiments, the gate stacks 23 includes a gate dielectric layer 230 and a gate electrode layer 231 positioned on the gate dielectric layer 230. The materials of the gate dielectric layer 230 and the gate electrode layer 231 are described above and not repeated again.

In some embodiments, as shown in FIGS. 4, 5A and 5B, the guarding structure in the second zone 12 of the guarding area $A_G$ also includes a via 26 formed on and electrically connected to the connecting structure 24. The guarding structure further includes a contact via 27 formed on and electrically connected the guarding layer 25. The contact via 27 is electrically insulated from the via 26 by the dielectric layer 22.

Moreover, in some embodiments, from a top view of the semiconductor substrate 20, the gate stack 23 includes a first portion 23M and a second portion 23E connected to the first portion 23M. FIG. 5A is a cross-sectional view related to the first portion 23M of the gate stack 23, and FIG. 5B is a cross-sectional view related to the second portion 23E of the gate stack 23. As shown in FIG. 4, the guarding layer 25 is disposed on the second portions 23E of the gate stacks 23, in accordance with some embodiments.

In some embodiments, the guarding structure in the second zone 12 of the guarding area $A_G$ further includes a conductive layer such as a metal layer $M1_{y2}$ formed on each of the contact vias 27. Also, the metal layer $M1_{y2}$ is electrically connected to the guarding layers 25 and the gate stacks 23 in the second zone 12 of the guarding area $A_G$. FIG. 4 and FIG. 5B depict the metal layer $M1_{y2}$ formed on one contact via 27 of the guarding structure. In practical applications, the second zone 12 of the guarding area $A_G$ may include several guarding structures arranged in the first direction D1. The metal layer $M1_{y2}$ formed on the contact vias 27 may extend in the first direction D1, so as to achieve electrical connection between the gate stacks 23 of the guarding structures in the second zone 12 of the guarding area $A_G$ through the contact vias 27 and the guarding layers 25.

Additionally, the guarding structure in the second zone 12 of the guarding area $A_G$ further includes another conductive layer, such as another metal layer $M1_{y1}$, formed on each of the vias 26 on the connecting structures 23. Thus, electrical connection between the diffusion regions 21 of the guarding structures in the second zone 12 can be achieved. In some embodiments, the metal layer $M1_{y1}$ is connected to the metal layer $M1_{x1}$, as shown in FIG. 2B.

In some embodiments, the guarding structures in the second zone 12 of the guarding area $A_G$ also provide capacitors. For example, when the diffusion regions 21 are coupled to a first voltage supply respectively through the vias 26 and the connecting structures 24, and the gate stacks 23 are coupled to a second voltage supply different from the first voltage supply through the contact via 27, at least two capacitors can be constructed in each of the guarding structures in the second zone 12 of the guarding area $A_G$.

In some embodiments, as shown in FIG. 5A, the gate electrode layer 231 of the gate stack 23 and the semiconductor substrate 20 form a fourth capacitor C4. Also, the gate electrode layer 231 of the gate stack 23 and the connecting structure 24 form a fifth capacitor C5. That is, when the first voltage supply applies a first voltage to the connecting structures 24 and the diffusion regions 21 while the second voltage supply applies a second voltage different from the first voltage to the gate stacks 23, the capacitances of the fourth capacitor C4 and the fifth capacitor C5 are not zero. In some embodiments, the capacitance of the fourth capacitor C4 is greater than the capacitance of the fifth capacitor C5. The fourth capacitor C4 and the fifth capacitor C5 are configured substantially the same as MOS capacitors, functioning as decoupling capacitors for reducing undesirable circuit power noise of the integrated circuit device.

In some embodiments, the guarding structure in the fourth zone 14 of the guarding area $A_G$ also includes a conductive layer (not shown) to connect the diffusion regions (not shown) of the guarding structures arranged in the fourth zone 14, wherein the conductive layer can be electrically connected to the metal layer $M1_{x1}$, as shown in FIG. 2B. In some embodiments, the metal layers $M1_{x1}$ in the first zone 11 and the third zone 13 are connected to the metal layers $M1_{y1}$ in the second zone 12 and the fourth zone 14, so that the diffusion regions of the guarding structures in all of the zones 11-14 of the guarding area $A_G$ can be electrically connected to each other.

Similarly, in some embodiments, the metal layers $M1_{X2}$ in the first zone 11 and the third zone 13 are connected to the metal layers $M1_{Y2}$ in the second zone 12 and the fourth zone 14, so that the gat stacks of the guarding structures in all of the zones (11-14) of the guarding area $A_G$ can be electrically connected to each other.

It should be realized that the metal layers $M1_{Y1}$, $M1_{Y2}$, $M1_{X1}$ and $M1_{X2}$ may have other configurations. The metal layers $M1_{Y1}$, $M1_{Y2}$, $M1_{X1}$ and $M1_{X2}$ can be formed in the same process. Additionally, in some embodiments, the metal layers $M1_{Y1}$, $M1_{Y2}$, $M1_{X1}$ and $M1_{X2}$ include copper, tungsten, aluminum, nickel, titanium, one or more other suitable conductive materials, or a combination thereof.

Noted that the configuration and disposition of the guarding structures in all of the zones (11-14) of the guarding area $A_G$ can be the same or different, which are determined according to actual requirements of the applications. For example, the configuration and disposition of the guarding structures in the first zone 11 can be identical to or different from the configuration and disposition of the guarding structures in the third zone 13. Similarly, the configuration and arrangement of the guarding structures in the second zone 12 can be identical to or different from the configuration and arrangement of the guarding structures in the fourth zone 14.

In accordance with some embodiments of the disclosure, an integrated circuit device includes many capacitors (such as decoupling capacitors). Those capacitors may have structures different from the configurations as shown in FIGS. 2A, 2B, 3, 4, 5A and 5B. According to the embodiments, the actual structural designs and the number of the guarding structures in different zones of the guarding area $A_G$ can be determined and varied depending on the design requirements of the practical applications.

Moreover, reduction of an overall area of the integrated circuit device of the embodiment is further investigated. In a testing chip containing an exemplary integrated circuit device having guarding structures with capacitors in the guarding area, the results indicate that an overall area of the exemplary integrated circuit device is decreased at least by about 10%.

Measurements of capacitance of the guarding structures are also conducted. According to the measurement results of the testing chip containing an exemplary integrated circuit device, the capacitance generated by the guarding structures of some embodiments extracted in the first direction D1 is approximately 7.2 fF/µm. The capacitance generated by the guarding structures of the some embodiments extracted in the second direction D2 is approximately 5.1 fF/µm. That is, in an example for guarding a 100 µm×100 µm circuit area by the guarding structures of some embodiments, approximately 2460 fF (=100×2×(5.1+7.2), which is about 2.4 pF) of the capacitance can be obtained. The capacitance generated by the guarding structures of the embodiments will be useful for more advanced process nodes such as 7 nm, 5 nm.

Additionally, in some embodiments, the capacitance generated in the guarding areas is mainly provided by the first capacitor C1 and the fourth capacitor C4 since the capacitance of the first capacitor C1 is much greater than that of the second capacitor C2/the third capacitor C3, and the capacitance of the fourth capacitor C4 is much greater than that of the fifth capacitor C5.

In accordance with the embodiments of the disclosure, the embodied guarding structures provide a sufficient amount of capacitance. With the capacitors created in the guarding area $A_G$ of the integrated circuit device as described above, the areas required for forming the capacitors in the circuit areas $A_C$ are significantly reduced. Thus, more compact arrangement of the components in the circuit areas $A_C$ can be implemented, which reduces an overall area of the integrated circuit device.

Figure 6:
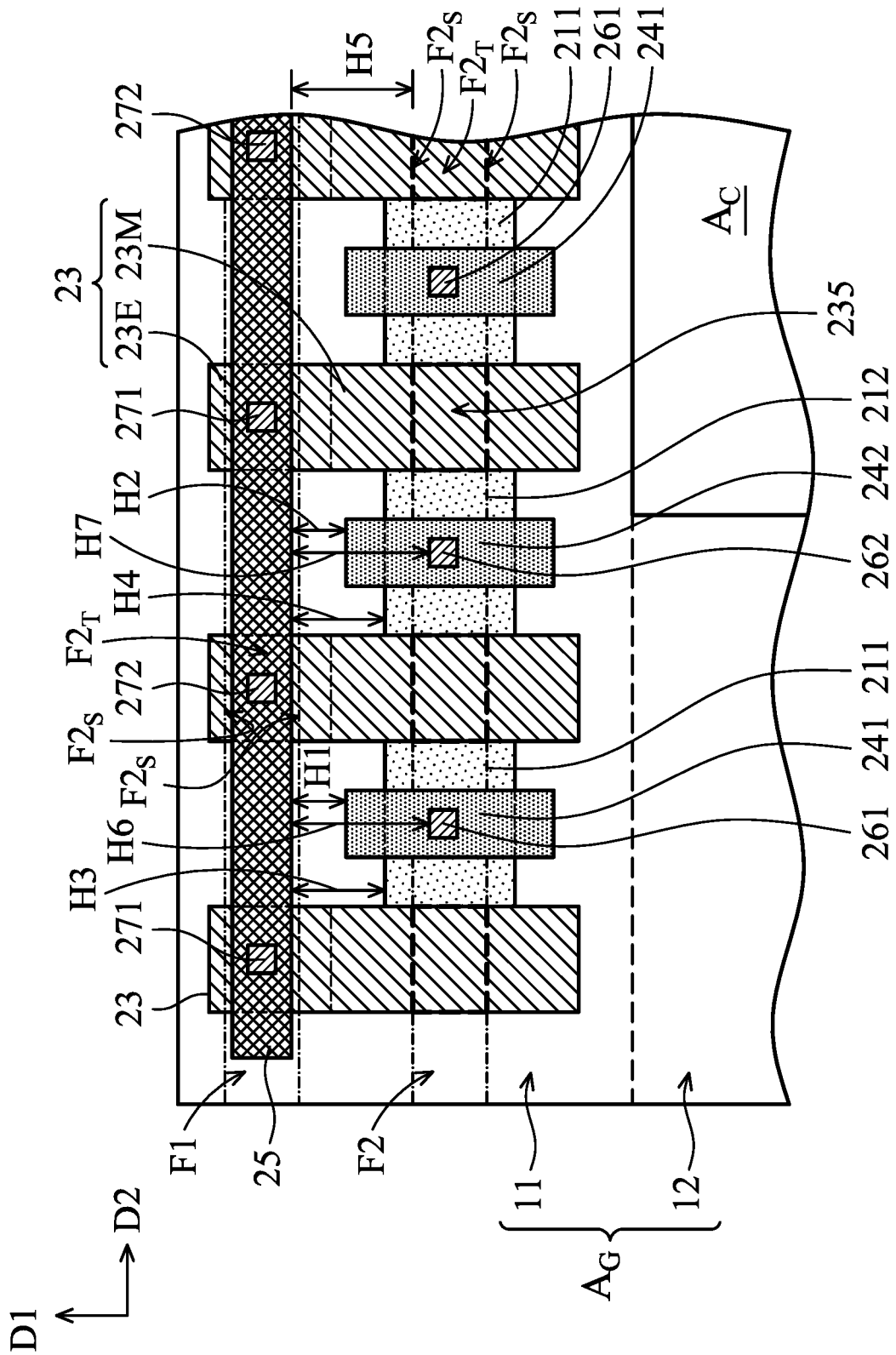
FIG. 6 is an enlarged view of the guarding structures overlapping with fins in the first zone of the guarding area, in accordance with some embodiments of the disclosure.

In some embodiments, the integrated circuit device will include one or more fin field-effect transistors (FinFETs) in the circuit area $A_C$. In some embodiments, the guarding structures can be integrated into a FinFET process for the FinFET applications. FIG. 6 is an enlarged view of the guarding structures overlapping with fins in the first zone of the guarding area, in accordance with some embodiments of the disclosure. Configurations of the components in FIG. 6 and FIG. 2A are identical except the fins are further depicted in FIG. 6. Also, the components in FIG. 6 that are the same as those in FIG. 2A are labeled with the same reference numbers as in FIG. 2A, and the details are not redundantly described for brevity.

In some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In some embodiments, the semiconductor substrate 20 includes fin structures separated from each other and arranged in parallel. In an exemplary embodiment, a first fin F1 and a second fin F2 are depicted for exemplifying two of the fin structures, as shown in FIG. 6. The first fin F1 and the second fin F2 that are separated from each other and arranged in parallel extend in the second direction D2. Also, the first fin F1 is farther away from the circuit area $A_C$ than the second fin F2 in the first zone 11 of the guarding area $A_G$. In some embodiments, a portion of the second fin F2 overlapping the gate structure 23 is defined as the channel region 235, and the channel portion region 235 is positioned between the first diffusion region 211 (such as a source region) and the second diffusion region 212 (such as a drain region). In addition, the first diffusion region 211 and the second diffusion region 212 are positioned on opposite sides of the gate structure 23. Furthermore, in some embodiments, the second portion 23E of the gate stack 23 is disposed on the top surface $F1_T$ and opposite sidewalls $F1_S$ of the first fin F1. The first portion 23M of the gate stack is disposed on the top surface $F2_T$ and opposite sidewalls $F2_S$ of the second fin F2.

In some embodiments, from a top view of the semiconductor substrate 20, the guarding layer 25 on the second portions 23E of the gate stack 23 is positioned above and overlaps with at least one fin, such as the first fin F1, as shown in FIG. 6.

Noted that the arrangement of the fin structures as shown in FIG. 6 is for illustration, not for limitation. From a top view of the semiconductor substrate 20, one guarding layer 25 may be arranged correspondingly to one of the fin structures, and the guarding layer 25 may completely overlap or partially overlap (not shown) with one fin structure. Alternatively, one guarding layer 25 may be arranged correspondingly to several fin structures, and the guarding layer 25 may overlap with several fin structures.

According to the aforementioned descriptions, embodiments provide an integrated circuit device. The integrated circuit device includes a guarding structure with several decoupling capacitors on a semiconductor substrate and disposed within the guarding area $A_G$. Therefore, the guarding structure of the embodiment not only reduces the noise between the circuits in adjacent circuit areas, but also provides function of decoupling capacitors in the guarding area. With the decoupling capacitors created in the guarding area $A_G$ of the embodiment as described above, the areas required for forming the decoupling capacitors in the circuit areas $A_C$ can be significantly reduced. Consequently, an overall area of the integrated circuit device can be decreased. In accordance with some embodiments of the disclosure, an integrated circuit device includes many decoupling capacitors that have different structures as shown in FIGS. 2A, 2B, 3A, 3B, 4, 5A, 5B and 6. The actual structure and number of decoupling capacitors are determined by design requirements.

It should be noted that the details of the structures of the embodiments are provided for exemplification, and the described details of the embodiments are not intended to limit the present disclosure. It should be noted that not all embodiments of the invention are shown. Modifications and variations can be made without departing from the spirit of the disclosure to meet the requirements of the practical applications. Thus, there may be other embodiments of the present disclosure which are not specifically illustrated. Further, the accompany drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit device, comprising:
    a semiconductor substrate having a circuit area and a guarding area surrounding the circuit area;
    a guarding structure in the guarding area, and the guarding structure comprising:
    a diffusion region in the semiconductor substrate;
    a gate stack disposed on the semiconductor substrate and positioned adjacent to the diffusion region, wherein the gate stack extends in a first direction;
    a connecting structure disposed on and electrically connected to the diffusion region; and
    a guarding layer disposed on the gate stack, wherein the guarding layer extends in a second direction that is different from the first direction,
    wherein the guarding layer is electrically insulated from the connecting structure, and
    wherein the guarding structure further comprises a via on the connecting structure, wherein the guarding layer that extends in the second direction is electrically insulated from the via in the first direction.

2. The integrated circuit device as claimed in claim 1, wherein the guarding layer is separated from the connecting structure by a first distance in the first direction.

3. The integrated circuit device as claimed in claim 2, wherein the diffusion region is a first diffusion region, the connecting structure is a first connecting structure, and the guarding structure further comprises:
    a second diffusion region in the semiconductor substrate, wherein the gate stack is positioned between the first diffusion region and the second diffusion region; and
    a second connecting structure disposed on and electrically connected to the second diffusion region, wherein the guarding layer is electrically insulated from the second connecting structure, and the guarding layer is separated from the second connecting structure by a second distance in the first direction.

4. An integrated circuit device, comprising:
    a semiconductor substrate having a circuit area and a guarding area surrounding the circuit area;
    a guarding structure in the guarding area, and the guarding structure comprising:
    a diffusion region in the semiconductor substrate;
    a gate stack disposed on the semiconductor substrate and positioned adjacent to the diffusion region, wherein the gate stack extends in a first direction;
    a connecting structure disposed on and electrically connected to the diffusion region; and
    a guarding layer disposed on the gate stack, wherein the guarding layer extends in a second direction that is different from the first direction,
    wherein the guarding layer is electrically insulated from the connecting structure,
    wherein the guarding layer is separated from the connecting structure by a first distance in the first direction,
    wherein the diffusion region is a first diffusion region, the connecting structure is a first connecting structure, and the guarding structure further comprises:
        a second diffusion region in the semiconductor substrate, wherein the gate stack is positioned between the first diffusion region and the second diffusion region; and
        a second connecting structure disposed on and electrically connected to the second diffusion region, wherein the guarding layer is electrically insulated from the second connecting structure, and the guarding layer is separated from the second connecting structure by a second distance in the first direction,
    wherein the guarding layer is separated from the first diffusion region by a third distance in the first direction, and separated from the second diffusion region by a fourth distance in the first direction.

5. The integrated circuit device as claimed in claim 3, wherein the guarding structure comprises a channel region between the first diffusion region and the second diffusion region, and the guarding layer is separated from the channel region in the first direction.

6. The integrated circuit device as claimed in claim 1, wherein the gate stack comprises:
    a first portion; and
    a second portion connected to the first portion and extending in the first direction, wherein the guarding layer is disposed on the second portion of the gate stack.

7. An integrated circuit device, comprising:
    a semiconductor substrate having a circuit area and a guarding area surrounding the circuit area;
    a guarding structure in the guarding area, and the guarding structure comprising:
    a diffusion region in the semiconductor substrate;
    a gate stack disposed on the semiconductor substrate and positioned adjacent to the diffusion region, wherein the gate stack extends in a first direction;

a connecting structure disposed on and electrically connected to the diffusion region; and
a guarding layer disposed on the gate stack, wherein the guarding layer extends in a second direction that is different from the first direction,
wherein the guarding layer is electrically insulated from the connecting structure,
wherein the gate stack comprises:
a first portion; and
a second portion connected to the first portion and extending in the first direction,
wherein the guarding layer is disposed on the second portion of the gate stack,
wherein the semiconductor substrate comprises a first fin and a second fin separated from each other and arranged in parallel, wherein the first fin and the second fin extend in the second direction, wherein the second portion of the gate stack is disposed on the first fin, and the first portion of the gate stack is disposed on the second fin.

8. The integrated circuit device as claimed in claim 7, wherein the guarding layer on the second portion of the gate stack is positioned above the first fin and overlaps with the first fin from a top view of the semiconductor substrate.

9. The integrated circuit device as claimed in claim 6, wherein the guarding structure further comprises a contact via on the guarding layer, and the contact via is electrically connected to the second portion of the gate stack through the guarding layer.

10. The integrated circuit device as claimed in claim 6, wherein the guarding structure further comprises a via on the connecting structure, wherein the guarding layer that extends in the second direction is electrically insulated from the via in the first direction.

11. An integrated circuit device, comprising:
a semiconductor substrate having a circuit area and a guarding area surrounding the circuit area;
a guarding structure in the guarding area, and the guarding structure comprising:
a diffusion region in the semiconductor substrate;
a gate stack disposed on the semiconductor substrate and positioned adjacent to the diffusion region, wherein the gate stack extends in a first direction;
a connecting structure disposed on and electrically connected to the diffusion region; and
a guarding layer disposed on the gate stack, wherein the guarding layer extends in a second direction that is different from the first direction,
wherein the guarding layer is electrically insulated from the connecting structure, and
wherein the diffusion region is coupled to a first voltage supply, and the gate stack is coupled to a second voltage supply that is different from the first voltage supply.

12. An integrated circuit device, comprising:
a semiconductor substrate having a circuit area and a guarding area surrounding the circuit area;
a guarding structure in the guarding area, and the guarding structure comprising:
a diffusion region in the semiconductor substrate;
a plurality of gate stacks disposed on the semiconductor substrate and positioned adjacent to the diffusion region, wherein the plurality of gate stacks extend in a first direction; and
a guarding layer disposed on the plurality of gate stacks, and the guarding layer electrically connected to the plurality of gate stacks, wherein the guarding layer extends in a second direction, and the second direction is different from the first direction,
wherein the guarding layer is electrically insulated from the diffusion region,
wherein the diffusion region is coupled to a first voltage supply, the plurality of gate stacks are coupled to a second voltage supply, and the second voltage supply is different from the first voltage supply.

13. The integrated circuit device as claimed in claim 12, wherein the guarding structure further comprises a connecting structure disposed on and electrically connected to the diffusion region, and the guarding layer is electrically insulated from the connecting structure and separated from the connecting structure by a distance in the first direction.

14. The integrated circuit device as claimed in claim 13, wherein the guarding structure further comprises a via on the connecting structure, and the guarding layer that extends in the second direction is electrically insulated from the via and separated from the via in the first direction.

15. The integrated circuit device as claimed in claim 12, wherein the guarding layer is separated from the diffusion region by a distance in the first direction.

16. The integrated circuit device as claimed in claim 12, wherein the diffusion region is a first diffusion region, and the guarding structure further comprises:
a second diffusion region in the semiconductor substrate, wherein one of the gate stacks is positioned between the first diffusion region and the second diffusion region; and
a channel region between the first diffusion region and the second diffusion region, wherein the guarding layer that extends in the second direction is separated from the channel region in the first direction.

17. The integrated circuit device as claimed in claim 12, wherein each of the plurality of gate stacks comprises a first portion and a second portion connected to the first portion, and the second portion extends in the first direction,
wherein the guarding layer is disposed on the second portions of the plurality of gate stacks.

18. An integrated circuit device, comprising:
a semiconductor substrate having a circuit area and a guarding area surrounding the circuit area;
a guarding structure in the guarding area, and the guarding structure comprising:
a diffusion region in the semiconductor substrate;
a plurality of gate stacks disposed on the semiconductor substrate and positioned adjacent to the diffusion region, wherein the plurality of gate stacks extend in a first direction; and
a guarding layer disposed on the plurality of gate stacks, and the guarding layer electrically connected to the plurality of gate stacks, wherein the guarding layer extends in a second direction, and the second direction is different from the first direction,
wherein the guarding layer is electrically insulated from the diffusion region,
wherein each of the plurality of gate stacks comprises a first portion and a second portion connected to the first portion, and the second portion extends in the first direction,
wherein the guarding layer is disposed on the second portions of the plurality of gate stacks,
wherein the semiconductor substrate comprises fin structures separated from each other and arranged in parallel, and the fin structures extend in the second direction, and wherein the guarding layer on the second portions of the gate stack is positioned above and overlaps with one of the fin structures from a top view of the semiconductor substrate.

19. The integrated circuit device as claimed in claim 17, wherein the guarding structure further comprises contact vias on the guarding layer, and the contact vias are electrically connected to the corresponding second portions of the plurality of gate stacks by the guarding layer.

20. The integrated circuit device as claimed in claim 18, wherein the diffusion region is coupled to a first voltage supply, the plurality of gate stacks are coupled to a second voltage supply, and the second voltage supply is different from the first voltage supply.

* * * * *